US011563426B2

(12) United States Patent
Sjöland et al.

(10) Patent No.: US 11,563,426 B2
(45) Date of Patent: Jan. 24, 2023

(54) SIGNAL GENERATOR WITH DIRECT DIGITAL SYNTHESIS AND TRACKING FILTER

(71) Applicant: Telefonaktiebolaget LM Ericsson (publ), Stockholm (SE)

(72) Inventors: Henrik Sjöland, Lund (SE); Henrik Fredriksson, Lund (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 17/291,897

(22) PCT Filed: Nov. 8, 2018

(86) PCT No.: PCT/EP2018/080678
§ 371 (c)(1),
(2) Date: May 6, 2021

(87) PCT Pub. No.: WO2020/094234
PCT Pub. Date: May 14, 2020

(65) Prior Publication Data
US 2022/0006449 A1 Jan. 6, 2022

(51) Int. Cl.
H03K 5/24 (2006.01)
H03K 5/1252 (2006.01)
(Continued)

(52) U.S. Cl.
CPC ............. H03K 5/1252 (2013.01); G06F 1/02 (2013.01); H03K 5/24 (2013.01); H04W 88/02 (2013.01); H04W 88/08 (2013.01)

(58) Field of Classification Search
CPC . H03L 7/02; H03L 7/091; H03L 7/099; H03L 7/101; H03L 7/102; H03L 7/103;
(Continued)

(56) References Cited

U.S. PATENT DOCUMENTS 4,965,533 A 10/1990 Gilmore
5,394,117 A 2/1995 Cohen
(Continued)

OTHER PUBLICATIONS

International Search Report and Written Opinion dated May 16, 2019 for International Application No. PCT/EP2018/080678 filed Nov. 8, 2021, consisting of 12—pages.
(Continued)

Primary Examiner — Long Nguyen
(74) Attorney, Agent, or Firm — Christopher & Weisberg, P.A.

(57) ABSTRACT

A signal generator with direct digital synthesis and tacking filter to generate an oscillator signal. A digital signal generator generates a digital signal; a digital to analog converter is connected to an output of the digital signal generator and converts the digital signal to an analog signal; a filter is coupled to an output of the DAC and filters the analog signal and generates the oscillator signal; a comparator is coupled to an output of the filter and generates a signal indicating zero crossings of the filter output signal; a digital control unit is coupled to outputs of the digital signal generator and comparator and generates a control signal to tune the filter to track a center frequency of the generated oscillator signal. The control signal is generated based on adjacent samples values from the digital signal generator before and after zero crossings of the filter output signal.

20 Claims, 7 Drawing Sheets

(51) Int. Cl.
*G06F 1/02* (2006.01)
*H04W 88/02* (2009.01)
*H04W 88/08* (2009.01)

(58) Field of Classification Search
CPC ... H03L 7/146; H03L 2207/06; H03K 5/1252; H03K 5/24; H03K 2217/96702; G06F 1/02; G06F 1/022; G06F 1/0321; G06F 1/0328; H04W 88/02; H04W 88/08; H03B 1/04; H03J 1/0008; H03J 7/04
See application file for complete search history.

(56) References Cited

U.S. PATENT DOCUMENTS

| | | | |
|---|---|---|---|
| 5,408,687 | A | 4/1995 | Ooga |
| 6,977,557 | B1 | 12/2005 | Frerking |
| 9,083,351 | B1 | 7/2015 | Lee et al. |
| 2004/0036538 | A1 | 2/2004 | Devries et al. |
| 2009/0086795 | A1* | 4/2009 | Rofougaran ............ H04L 27/16 375/216 |
| 2013/0141146 | A1* | 6/2013 | Shima .................... H03L 7/08 327/157 |

OTHER PUBLICATIONS

Umar J. Lyles et al.; An Injection-Locked Frequency-Tracking ΣΔ Direct Digital Frequency Synthesizer; IEEE Transactions on Circuits and Systems—II: Express Briefs, vol. 54, No. 5, May 2007, consisting of 5—pages.

\* cited by examiner (a)

(b)

(c)

SIGNAL GENERATOR WITH DIRECT DIGITAL SYNTHESIS AND TRACKING FILTER

CROSS-REFERENCE TO RELATED APPLICATION

This application is a Submission Under 35 U.S.C. § 371 for U.S. National Stage Patent Application of International Application Number: PCT/EP2018/080678, filed Nov. 8, 2018 entitled "A SIGNAL GENERATOR WITH DIRECT DIGITAL SYNTHESIS AND TRACKING FILTER," the entirety of which is incorporated herein by reference.

TECHNICAL FIELD

Embodiments herein relate to a signal generator and method therein. In particular, they relate to a signal generator with direct digital synthesis and tracking filter to generate an oscillator signal and apparatus comprising the signal generator.

BACKGROUND

Wireless communication systems usually comprise complex chains of transmitter and receiver circuits, including several frequency conversion steps. The transmitter circuits typically up-convert baseband signals to Radio Frequency (RF) signals for transmission, and the receiver circuits down-convert received RF signals to baseband signals for processing. Such frequency conversion requires mixers to mix the RF or baseband signal with a local oscillator (LO) signal, i.e. a clock signal.

There is a strong trend in transceivers, i.e. transmitter and receiver circuits, to use more parts that require accurate high frequency clock signals. A good example is multi-path filters, featuring mixers with multi-phase clock signals at a center frequency of the filter. Several different filters may be used simultaneously, requiring multiple clock signal frequencies to be generated, all with multiple phases. Another example is an auxiliary receiver to monitor a signal spectrum, to detect interference from outside, or to detect distortion from its own transmitter. Such a receiver may need quadrature clock signals, and it may also need additional clock phases if a harmonic rejection mixer is used. Multiple clock frequencies may also be needed for reception and transmission of main signals. This may also require quadrature clock signals, and harmonic rejection. Simultaneous operation with multiple carrier frequencies may require a multitude of clock signals to be generated also for the main signal.

In total many different clock signals at different frequencies may have to be generated on a transceiver chip. Using conventional phase locked loop (PLL) frequency synthesizers to generate all these signals will result in problems with coupling between oscillators, causing spurious frequencies. These spurious frequencies will cause reception or transmission of unintended signals, which may ruin the performance of the system. Another way to generate the clock signal is to use direct digital synthesis (DDS). In that case digital signals are generated using sinusoidal data stored in memories. The digital signals are converted to analog form in high speed digital to analog converters (DACs), and finally frequency components above a desired range are removed in analog low-pass filters, also known as reconstruction filters. The high-speed DACs, digital memories, and analog filters make the solution expensive in terms of chip area and power consumption. Furthermore, the filters are wideband, and the generated signals will therefore be affected by wideband noise. However, it is more robust than generating all signals in separate PLLs. If very high spectral purity is required, the specifications for DAC dynamic range and filter sharpness and dynamic range will be very demanding. A compromise may be to generate signals with lesser requirements with DDS, and those with high requirements with PLLs.

DDS and oscillators or high Q filters have previously been used in frequency synthesis. In U.S. Pat. No. 4,965,533A, DDS is used to generate a reference signal to a PLL with fine frequency control, or to provide a fine controlled frequency divider in a feedback path of a PLL. This allows the system to generate signals with frequencies beyond the capabilities of stand-alone DDS. U.S. Pat. No. 5,394,117A describes the use of DDS to generate a signal with which to injection lock an oscillator, where sub-harmonic locking allows the system to generate high frequency signals. U.S. Pat. No. 6,977,557B1 describes the use of DDS to generate an injection signal to force a crystal oscillator into a particular oscillation mode.

More and more clock signals are needed in modern transceiver chips. It then becomes impractical to generate all of them with PLLs, since keeping disturbances due to coupling between oscillators at acceptable levels then becomes prohibitively difficult. To ease the problem some of the clock signals may be generated with DDS. However, DDS is expensive since it requires high speed and high-resolution DACs, large memories storing sinusoidal data, and sharp analog low-pass reconstruction filters with low noise.

SUMMARY

Therefor it is an object of embodiments herein to provide an improved method and apparatus to generate oscillator signals.

According to one aspect of embodiments herein, the object is achieved by a signal generator with DDS and tracking filter to generate an oscillator signal. The signal generator comprises a digital signal generator configured to generate a digital signal. The signal generator further comprises a digital to analog converter (DAC) connected to an output of the digital signal generator, configured to convert the digital signal to an analog signal. The signal generator further comprises a filter coupled to an output of the DAC, configured to filter the analog signal and generate the oscillator signal.

The signal generator further comprises a comparator coupled to an output of the filter, configured to generate a signal indicating zero crossings of the filter output signal. The signal generator further comprises a digital control unit coupled to outputs of the digital signal generator and comparator, configured to generate a control signal to tune the filter. The control signal is generated based on adjacent samples values from the digital signal generator before and after zero crossings of the filter output signal.

According to one aspect of embodiments herein, the object is achieved by a method for generating an oscillator signal in a signal generator with DDS and tracking filter. The signal generator comprises a digital signal generator, a digital to analog converter (DAC), a filter, a comparator and a digital control unit. The digital signal generator generates a digital signal. The DAC converts the digital signal to an analog signal. The filter filters the analog signal to generate the oscillator signal. The comparator generates a signal indicating zero crossings of an output signal from the filter. The digital control unit sums adjacent samples values from the digital signal generator before and after zero crossings of the filter output signal and weights the sum value with a coefficient to generate a control signal based on the weighted sum value. The control signal is used to tune the filter to track a center frequency of the generated oscillator signal.

In other words, in the signal generator according to the embodiments herein, the filter following the DAC is tuned to track the frequency of the generated oscillator signal. So the filter may be implemented as a narrow bandpass filter centered at the oscillator signal frequency and may effectively suppress wideband noise and distortion products far from the frequency of interest. In this way, the requirements on the DAC and filter may be significantly relaxed, leading to reduced power consumption. The filter may be realized using passive components for minimum power consumption and maximum dynamic range. The filter area may be small, since a single inductor is sufficient. A tuning algorithm is provided to ensure that the narrow-band filter is centered at the correct frequency. This algorithm is performed in the digital domain, and the only additional analog part needed is a single comparator to obtain information about the generated oscillator signal polarity. Further, the filter may be implemented as a part of the DAC, by implementing it as a tuned LC load of a current steering DAC. The tuned output of the filter then further relaxes the DAC design by resonating with output capacitance of the DAC.

Therefore, the signal generator and method therein according to the embodiments herein provide an improved method and apparatus to generate oscillator signals.

BRIEF DESCRIPTION OF THE DRAWINGS

Examples of embodiments herein are described in more detail with reference to attached drawings in which.

DETAILED DESCRIPTION

An output signal of a DDS is supposed to be a signal at a certain frequency. The output signal frequency is programmable and will change from time to time, but each time it is used as an LO signal in a filter, a mixer or transceiver it will be at a fixed frequency. The analog low-pass filter or reconstruction filter following the DAC may therefore be implemented as a narrow bandpass filter centered at this frequency. Then wideband noise and spurs of the DDS output signal will be effectively suppressed by the narrow bandpass filter, the requirements on the DAC may therefore be reduced. However, it is very important that the narrow bandpass filter is properly centered to the output signal frequency, i.e. the narrow bandpass filter must track the center frequency of the DDS output signal. This DDS characteristic and the requirement on a tracking filter are observed and a signal generator with DDS and tracking filter and method for tuning the filter according to embodiments herein are therefore provided.

Figure 1:
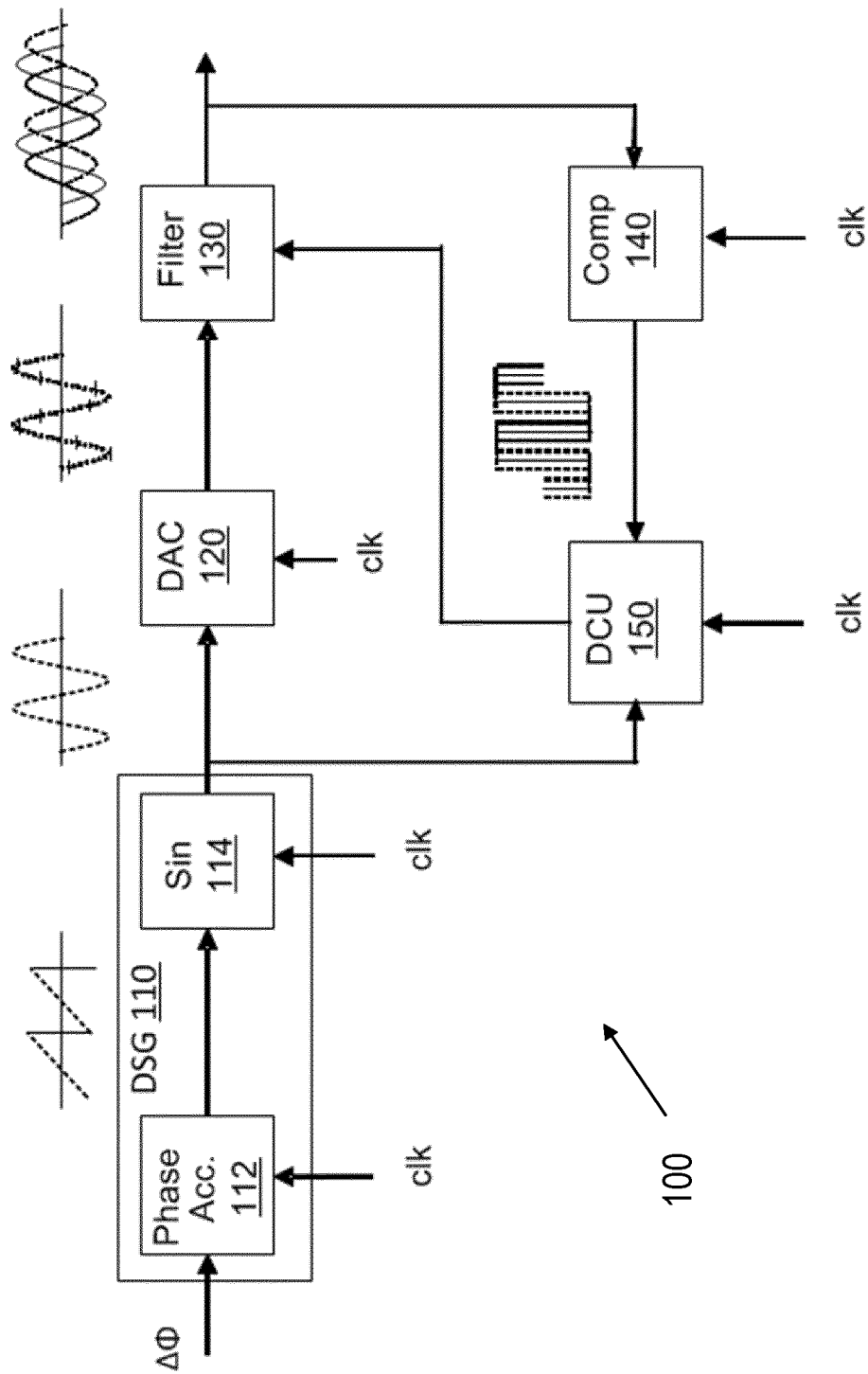
FIG. 1 is a schematic block view of a signal generator according to embodiments herein.

FIG. 1 is a schematic block view showing architecture of a signal generator 100 with DDS and narrow-band tracking filter according to embodiments herein. Principle sketches of signals are also shown at different positions in a signal chain of the signal generator 100.

The signal generator 100 comprises a digital signal generator DSG 110 configured to generate a digital signal.

The signal generator 100 further comprises a digital to analog converter DAC 120 connected to an output of the digital signal generator DSG 110, configured to convert the digital signal to an analog signal.

The signal generator 100 further comprises a filter 130 coupled to an output of the DAC 120, configured to filter the analog signal and generate the oscillator signal.

The signal generator 100 further comprises a comparator Comp 140 coupled to an output of the filter 130, configured to generate a signal indicating zero crossings of the filter output signal.

The signal generator 100 further comprises a digital control unit DCU 150 coupled to outputs of the digital signal generator DSG 110 and comparator 140, configured to generate a control signal to tune the filter 130 to track a center frequency of the generated oscillator signal. The control signal is generated based on adjacent samples values from the digital signal generator DSG 110 before and after zero crossings of the filter output signal.

In the context of the present application, a zero crossing of a signal is interpreted as "a time instant where the signal crosses an average value of the signal". This applies for both analog and digital signals, as well as for single ended and differential signals. That is, by "zero" it means Direct Current (DC) level of a signal, regardless of what arbitrary level is chosen as zero electrical potential in an analog domain or what arbitrary number representation is used in a digital domain. For example, if the filter output signal is an analog signal with a DC offset, detecting its zero-crossings means detecting crossings of the average value of the signal. That means the comparator 140 is configured to generate a signal indicating a DC level or an average value crossings of the filter output signal. A reference signal, to which the comparator compares the filter output signal, is set to the DC offset value.

In the following, function of each block in the signal generator 100 and principle of the control signal generation are explained.

In the DSG 110, a phase accumulator Phase Acc 112 holds a current phase value of a generated waveform. Each clock cycle clk a phase increment $\Delta\phi$ is added. If for instance the phase increment is 60 degrees, it takes 6 clock cycles to increase the phase by 360 degrees, i.e. one period. The generated output signal will then have a frequency equal to one sixth of the clock frequency. To keep the phase accumulator 112 value bounded within one period, each time the phase exceeds a certain value, 360 degrees are subtracted from the accumulator. This may also be accomplished by accumulator overflow, creating a modulo of one period. The output of the accumulator may be confined to a range of −180 degrees to +180 degrees. Any unit may be used inside the accumulator 112 to represent one period, so its content may for instance be contained between −1 and +1, or between −1000 and 1000.

The output of the phase accumulator 112 is input to a function unit Sin 114. The function unit 114 is configured to perform a mathematical sine function, such as y=a sin(x), y=b cos(x), or y=a sin(x)+b cos(x), where x represents the output of the phase accumulator 112, y represents the output of the function unit 114, and a and b are constants. The function unit 114 may be implemented in several different ways. For example, a lookup-table-memory may be a fast way of implementing a sine function, a Coordinate Rotation Digital Computer (CORDIC) may be an efficient alternative implementation for some applications or scenarios. If implemented as a memory, thanks to the narrow-band filtering of the filter 130, the accuracy may be relaxed, reducing the size of this memory. In addition, conventional techniques may be used requiring the memory to cover just a single quadrant of a signal.

The DAC 120 then follows the DSG 110, converting the digital signal to the analog domain. The DAC 120 may be a zero-order hold DAC and produce a staircase like signal, requiring reconstruction filtering. High speed DACs are often implemented using a current steering architecture. The output signal is then in a form of a differential current, and the filter 130 may be realized as a load impedance, converting the DAC 120 output current to a filtered output voltage. By implementing the filter 130 as a parallel inductance-capacitance (LC) resonator, a narrow band response may be realized, limited only by the Q-factor of the passive components. If even sharper filter response is desired, some negative resistance may be realized by differential cross-coupled transistor pairs. This may then cancel some of the loss resistance of the passive components, increasing the filter 130 quality factor. Furthermore the filter 130 may be made unstable, i.e. self-oscillating, being injection locked to a desired frequency by the DAC signal. The narrow-band filter response effectively suppressing noise and spuriouses, combined with the possibility to include the DAC 120 output capacitance in the filter 130 relaxes the DAC 120 design significantly.

The filter 130 output signal contains just one tone, plus some small jitter due to finite DAC resolution. If the filter 130 is tuned correctly, with a signal at its center frequency, there should be close to zero phase shift between the filter input and output for this signal. A tuned LC circuit will provide a real-valued impedance at its resonance, i.e. there is no phase shift between input current and output voltage. The filter output signal for correct tuning is indicated in the figure by a solid line, and signals for other tunings are indicated by dotted line and dashed line.

The clocked comparator 140 is connected to the filter 130 output to detect its output signal polarity, i.e. locations of zero crossings of the filter output signal. This information is used by the DCU 150, a digital tuner. The DCU 150 compares the zero crossings of the filter 130 output signal to the zero crossings of the digital input signal of the DAC 120. Discrepancies in the zero crossings are used to tune the filter 130.

The comparator 140 may be implemented as a single bit comparator to detect the zero crossings of the filter 130 output signal. By observing that the zero crossings of the signal current from the DAC 120 should coincide with the zero crossings of the tuned filter output voltage, the filter 130 may be properly tuned to track the frequency of the generated signal. The zero crossings of the DAC 120 input signal are available in the digital domain, i.e. the output of the DSG 110. So the DCU 150 compares the output of the DSG 100 to the output of the single bit comparator 140. The tuning algorithm may thus be performed digitally, and tune the filter 130 center frequency through a digital control signal.

The filter 130 may comprise any one or a combination of switched capacitors, varicaps or varactors so the capacitance of the filter 130 is tuned by the digital control signal.

Figure 2:
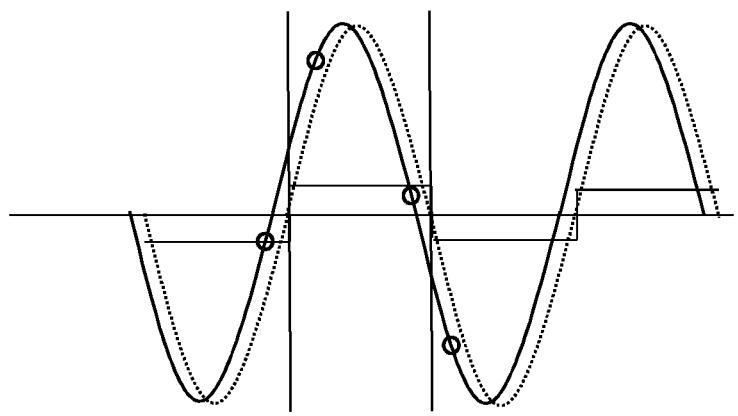
FIG. 2 are diagrams illustrating signals from digital signal generator, filter and comparator in the signal generator according to embodiments herein.
Figure 2:
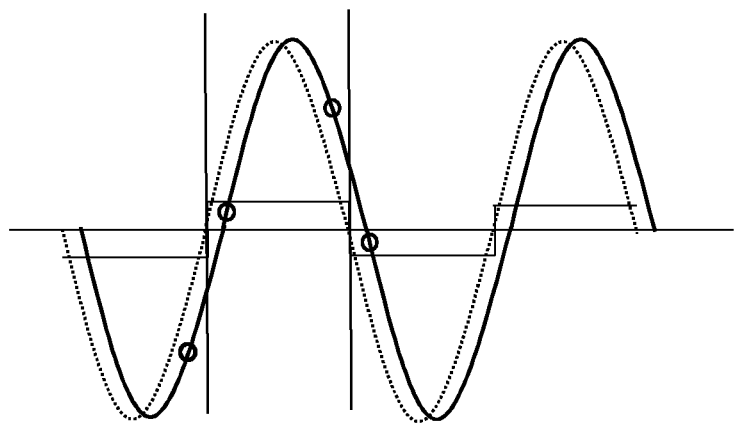
Figure 2:
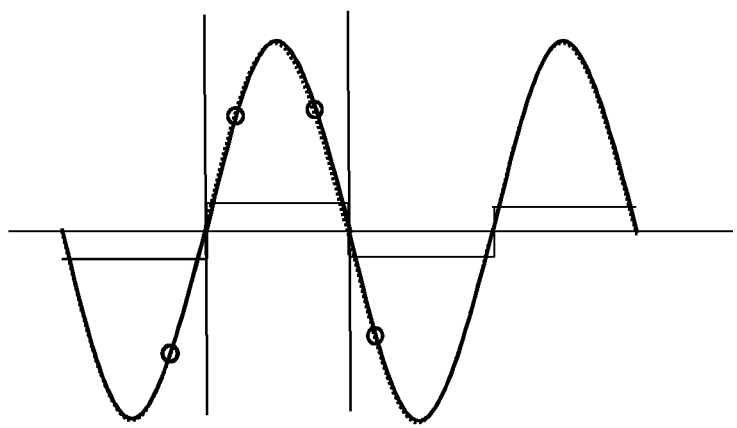

A core of the DCU 150 is to determine if the filter 130 output signal is leading or lagging the DAC 120 input signal. To determine that, signals for the leading and lagging cases are examined as shown in FIG. 2. FIG. 2 (*a*) shows signals when the filter output lags the DAC input, where the filter 130 output signal is shown with a dotted sinusoidal wave, the comparator output signal with a solid square wave, the DAC input signal with a solid sinusoidal wave and small circles indicating the DAC input samples. FIG. 2(*b*) shows signals when the filter output leads the DAC input. Note that for sake of clarity, time discretization of the comparator output signal due to clocking is not illustrated in the figure, but rather just showing between which digital samples a zero crossing occurs by a solid square wave.

As can be seen in FIG. 2 (*a*), when the filter 130 output is lagging, a sum of the two DAC input samples just before and after the comparator rising edge is positive. In FIG. 2 (*b*), when the filter 130 output is leading, a sum of the corresponding DAC input samples is instead negative.

In a tuning algorithm, as a rising edge between two DAC input samples is detected in the comparator 140 output signal, the DAC input values of these two samples should be summarized. The sum should then be weighted and subtracted from a current value of the control signal to control the filter capacitance. In this way, if the filter capacitance is larger than optimal and the filter output is hence lagging, a positive value will be subtracted from the current value of the digital control signal for reducing filter capacitance, the situation is then improved. If the filter capacitance is instead smaller than optimal and the filter output is leading, a negative value will be subtracted from the current value of the digital control signal for adding capacitance to the filter to improve the situation.

When looking at a falling edge, the situation is opposite. As shown in FIG. 2 (*a*), when the filter 130 output is lagging, a sum of the two DAC input samples just before and after the comparator falling edge is negative, and in the leading situation results in a positive sum for the corresponding DAC input samples. To adjust the filter capacitance in a correct direction, the sum of the samples, properly weighted, should then be added to the current value of the control signal to control the filter capacitance.

The tuning algorithm discussed above for rising and falling edge cases is assuming that the value of the digital control signal is positively proportional to the capacitance value of the filter 130. The value of the digital control signal may be negatively proportional to the capacitance value of the filter 130, then for rising edge case, the weighted sum should be added to the current value of the control signal, for falling edge case, the weighted sum should be subtracted from the current value of the control signal. It is thus important to detect if the comparator signal edge is falling or rising, as this requires a sign of the correction to shift depending on how the value of the digital control signal is related to the capacitance value of the filter.

FIG. 2 (*c*) shows when the filter 130 is properly tuned and its output signal coincides with the DAC 120 input signal, then a sum of the two DAC input samples just before and after the comparator rising or falling edge is zero or close to zero. Note that the samples may not be symmetric around the zero crossing at each occurrence, but on average the sum of the two samples will be close to zero, and for this reason the weighting factor should be low or some other means of filtering should be used to provide averaging in the system.

Figure 3:
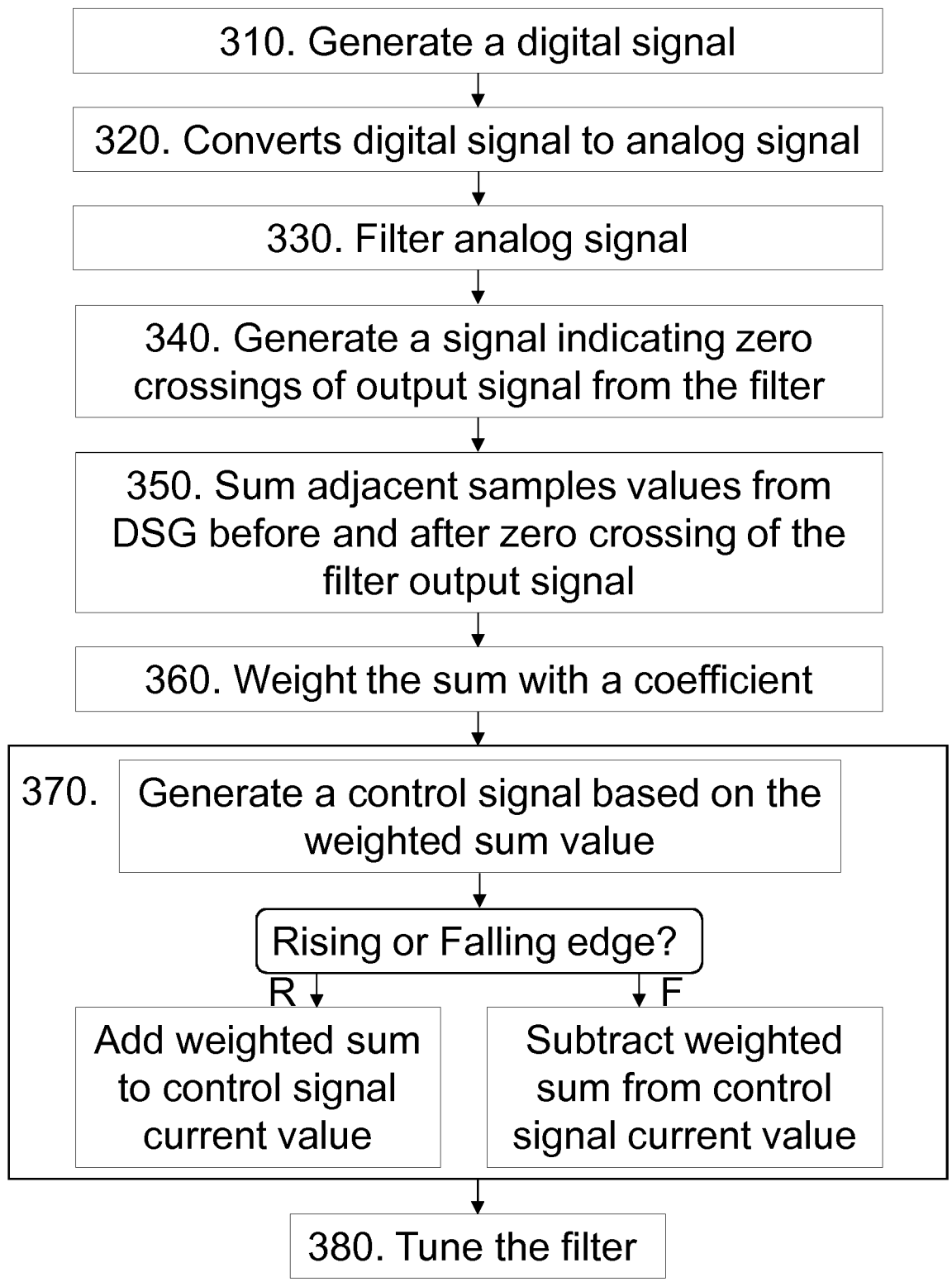
FIG. 3 is a flow chart showing a method to generate an oscillator signal in a signal generator according to embodiments herein.

According to embodiments herein, a method for generating an oscillator signal and a tuning technique in a signal generator 100 will be described with reference to FIG. 3. As described above with reference to FIG. 1, the signal generator 100 comprises a digital signal generator DSG 110, a digital to analog converter DAC 120, a filter 130, a comparator 140 and a digital control unit 150. The method comprises the following actions.

Action 310

The digital signal generator DSG 110 generates a digital signal.

Action 320

The DAC 120 converts the digital signal to an analog signal.

Action 330

The filter filters the analog signal to generate the oscillator signal.

Action 340

The comparator 140 generates a signal indicating zero crossings of an output signal from the filter 130.

Action 350

The digital control unit 150 sums two adjacent samples values from the digital signal generator 110 before and after the zero crossings of the filter 130 output signal.

Action 360

The digital control unit 150 weights the sum value with a coefficient. The coefficient is chosen depending on how fast a tuning algorithm results convergence, i.e. the filter 130 has reached steady-state. If the coefficient is low the tuning will be slow, but it can result a very clean output signal with small jitter due to the filter being tuned back and forth. If the coefficient is instead high the tuning will quickly reach convergence, but the output signal will have more jitter. There is a trade-off. A possibility is to start with a higher coefficient when the frequency of the DDS is changed, and then reduce it after a while when the control value has settled to provide a clean signal and just be able to track slow changes. In this way, advantages of the two cases are combined.

Action 370

The digital control unit 150 generates a control signal based on the weighted sum value. In other words, the digital control unit 150 generates a control signal based on adjacent samples values from the digital signal generator DSG 110 before and after zero crossings of the filter output signal. In addition to the weighting the control unit may also provide other filtering such as low-pass filtering to reduce disturbances on the control signal.

According to embodiments herein, if a sign of the comparator output signal has changed from previous sample, the digital control unit 150 finds direction of change to determine if the comparator output signal is a rising or falling zero crossing. When the signal from the comparator 140 is a rising edge at a zero crossing, the digital control signal may be generated by subtracting the weighted sum value from a current value of the control signal. When the signal from the comparator is a falling edge at a zero crossing, the digital control signal may be generated by adding a weighted sum value to the current value of the digital control signal.

Action 380

The digital control unit 150 tunes the filter 130 using the control signal to track a center frequency of the generated oscillator signal.

According to some embodiments herein, when a new DDS output frequency is commanded, a coarse tuning setting may be first calculated and applied. This may be based on interpolation between look-up table entries or on a polynomial function. This setting is then first applied to the filter 130. The DCU 150 will then fine tune the filter 130 to close to an optimum setting. By first applying a coarse tuning setting, the settling time for the filter 130 tuning may be significantly reduced. If settling time is less important the coarse tuning may be skipped, and the DCU 150 may perform the full tuning of the filter 130.

Figure 4:
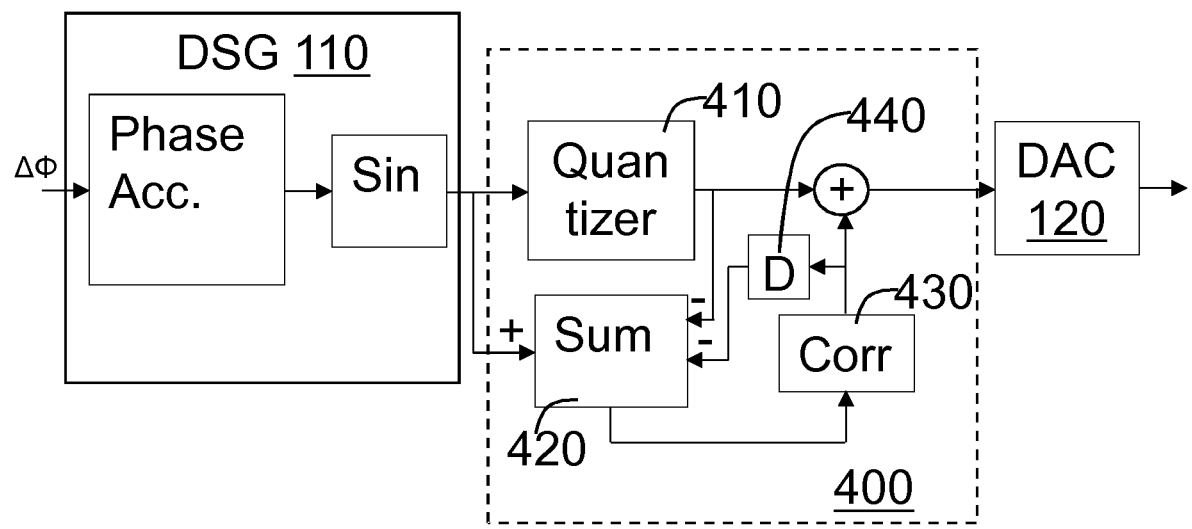
FIG. 4 is a schematic block view of a quantization noise accumulation suppression scheme according to embodiments herein.

To improve the performance of the signal generator 100, a quantization noise accumulation compensation circuit 400 may be coupled between the digital signal generator DSG 110 and the DAC 120, as shown in FIG. 4. The quantization noise accumulation compensation circuit 300 comprises a quantizer 410, a sum module Sum 420, a correction module Corr 430 and a delay module D 440. The quantization errors are found as a difference between the quantizer 410 input and output, which is then summed in the Sum 420. The output of the Sum 420 is fed to the correction module Corr 430. When the input of the quantizer 410 exceeds 0.5 Least Significant Bit (LSB), the output is set to 1LSB, when the input instead is below −0.5LSB the output is −1LSB. For input values between −0.5LSB and 0.5LSB, the output is zero. The output of the correction module Corr 430 is added to the quantizer 410 output. And in a next clock cycle it is also subtracted from the Sum 420, i.e. the output of the correction module Corr 430 is delayed by one clock cycle in the delay module D 440 and input to the Sum 420. This ensures that the absolute integrated quantization error in Sum 420 does not exceed one half LSB.

Simulations have been performed to show the performance of the signal generator 100 according to the embodiments herein using the following parameters:

Sample rate: 20 GS/s
Frequency: 2.31 GHz
Filter quality factor: 17.2
DAC bits: 5

Figure 5:
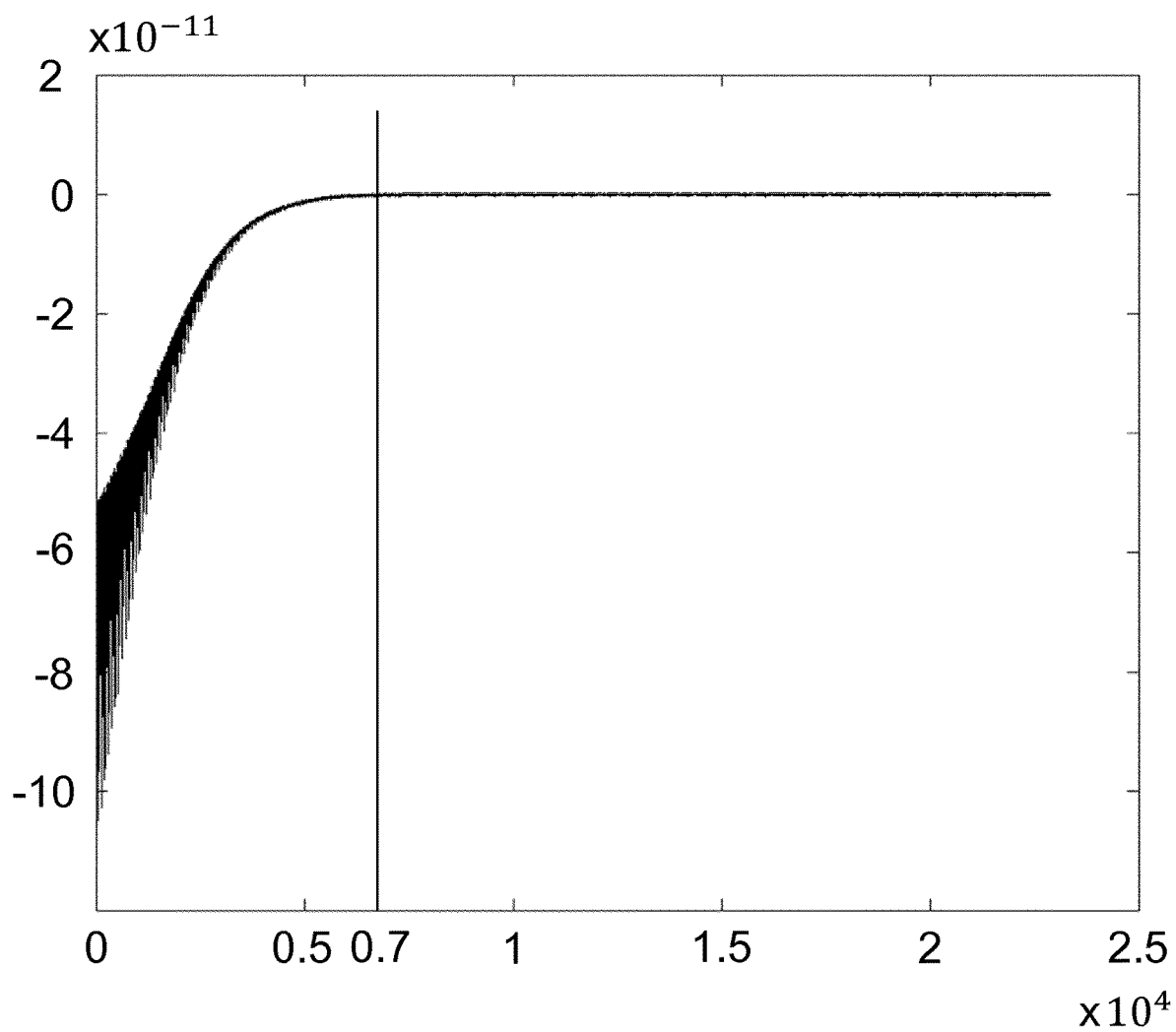
FIG. 5 is a diagram illustrating a simulation result for the signal generator according to embodiments herein.

FIG. 5 shows errors of the zero crossings between the DAC 120 input and the filter 130 output verses zero crossing numbers. It is clearly visible how the tuning algorithm works to adjust the errors to zero. As can be seen after about 7000 zero crossings, i.e. 3500 periods=1.5 µs, the output has converged with acceptable jitter.

Figure 6:
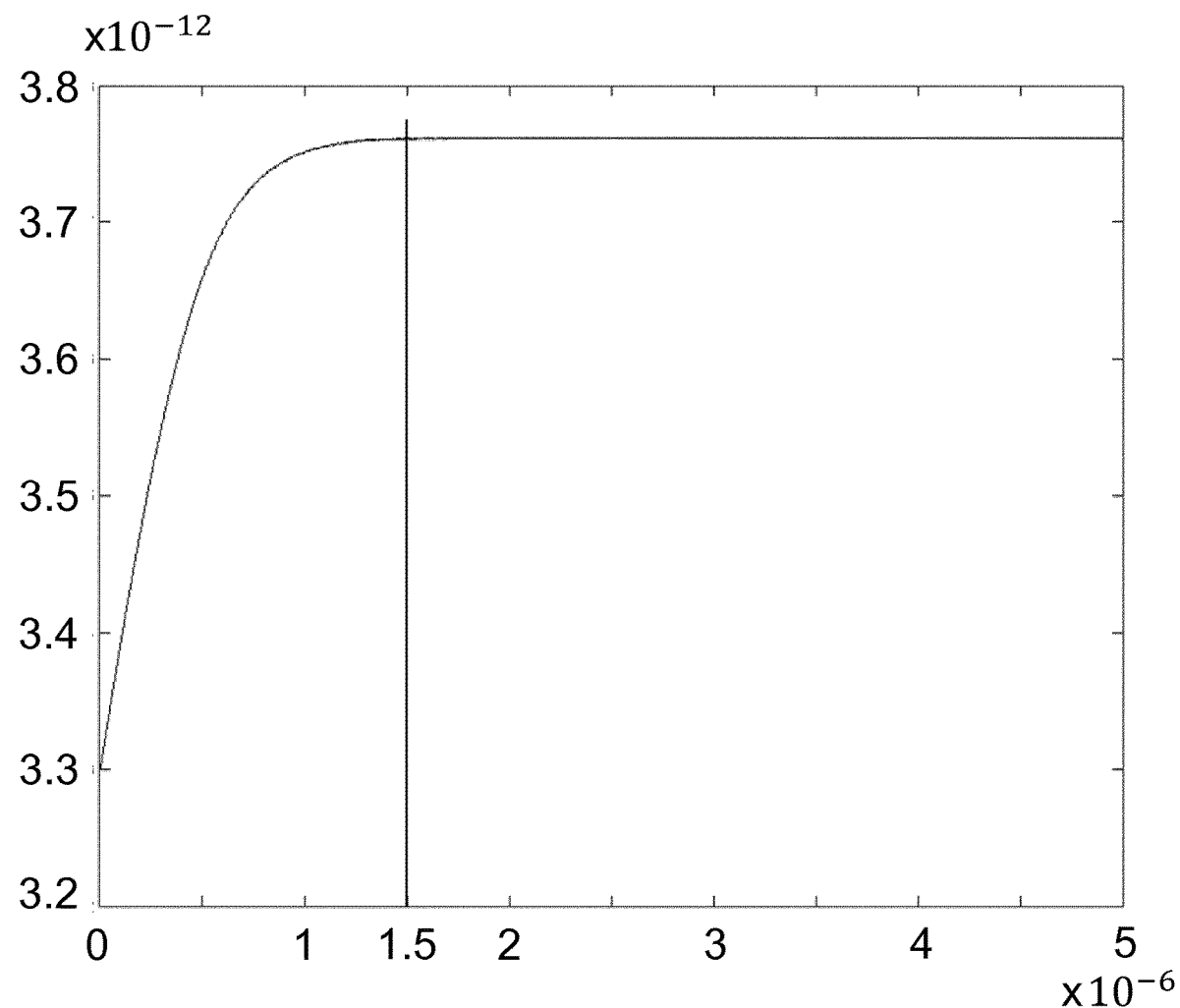
FIG. 6 is a diagram illustrating a simulation result for the signal generator according to embodiments herein.

FIG. 6 shows the filter 130 capacitance verses time. As can be seen the capacitance value converges after about 1.5 µs.

To summarize, according to embodiments herein, a local oscillator signal is generated using direct digital frequency synthesis and a tracking filter. Instead of a conventional low pass filter, a narrow-band tracking filter 130 is implemented. This suppresses wideband noise and spurious responses, relaxing the DAC 120 design. The DAC 120 may use a current-steering architecture, and the filter 130 may be tuned load impedance featuring a parallel resonator consisting of a capacitor and an inductor, of which at least one, typically the capacitor, is programmable to accurately set the resonance frequency. This further relaxes the DAC 120 design by including its output capacitance in the filter 130. It is possible to increase the filter Q by a negative resistance, and even to make the filter self-oscillating and injection locked. The filter 130 is tuned using information from a single clocked comparator 140 connected to the filter 130 output. That digital information is compared to the DAC 120 digital input, allowing tuning of the LC filter through a digital control signal. To further minimize the jitter, a quantization noise accumulation compensation circuit 400 is implemented. The sum of quantization noise is prevented from exceeding +/−0.5 LSB by adding a compensation +/−1 LSB when necessary.

Figure 7:
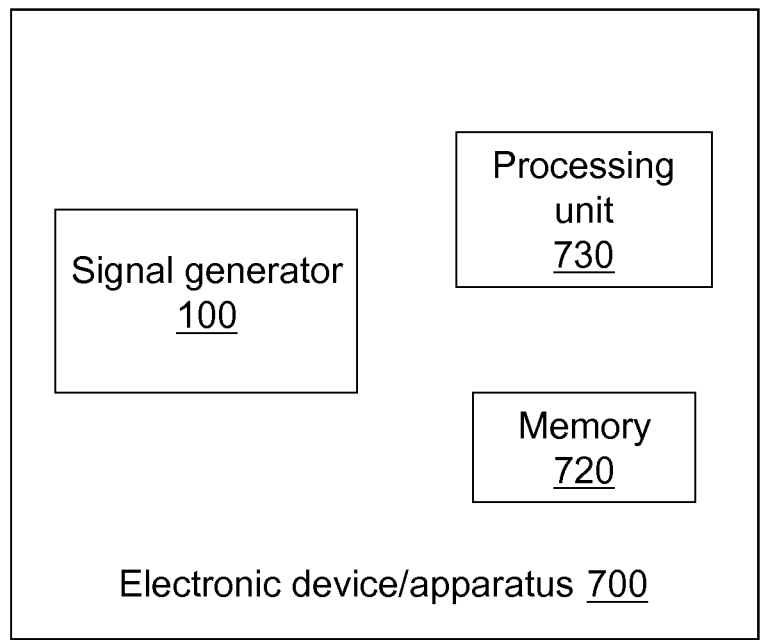
FIG. 7 is a block diagram illustrating an electronic device in which a signal generator according embodiments herein may be implemented.

The signal generator 100 according to the embodiments herein may be employed in various integrated circuits, electronic circuits, devices or apparatus. FIG. 7 shows a block diagram for an electronic device or apparatus 700. The electronic device/apparatus 700 comprises a signal generator 100. The electronic device/apparatus 700 may be a transmitter, a receiver or a transceiver etc. in a cellular communications network. The electronic device/apparatus 700 may comprise other units, where a memory 720, a processing unit 730 are shown. The electronic device/apparatus 700 may be a user equipment or a mobile device, a wireless communication device, a radio base station for a cellular communication system.

The word "comprise" or "comprising", when used herein, shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. An oscillator signal generator configured to generate an oscillator signal, the oscillator signal generator comprising:
   a digital signal generator configured to generate a digital signal;
   a digital to analog converter (DAC) configured to receive and convert the digital signal to an analog signal;
   a filter configured to receive and filter the analog signal and generate the oscillator signal;
   a comparator configured to receive the oscillator signal and generate a comparator output signal indicating zero crossings of the oscillator signal; and
   a digital control unit (DCU) configured to receive the comparator output signal and the digital signal and to generate a control signal to tune the filter to track a center frequency of the digital signal;
   the control signal being based at least in part on adjacent samples of the digital signal before and after zero crossings of the oscillator signal.

2. The oscillator signal generator according to claim 1, wherein the DAC is a current-steering DAC, and the filter is a parallel inductance-capacitance (LC) resonator.

3. The oscillator signal generator according to claim 1, further comprising a quantization noise accumulation compensation circuit coupled between the digital signal generator and the DAC.

4. The oscillator signal generator according to claim 1, wherein:
   when a rising edge between first samples of the digital signal adjacent to an indicated zero crossing of the oscillator signal is detected in the comparator output signal, the control signal is generated by subtracting a weighted sum of the adjacent samples values before and after the zero crossing from a current value of the control signal; and
   when a falling edge between the first samples adjacent to the zero crossing is detected in the comparator output signal, the control signal is generated by adding a weighted sum of the adjacent samples values before and after the zero crossing from a current value of the control signal.

5. The oscillator signal generator according to claim 1, wherein the control signal is applied to control capacitance in the filter.

6. The oscillator signal generator according to claim 1, wherein the filter comprises any one or a combination of switched capacitors, varicaps and varactors.

7. The oscillator signal generator according to claim 1, wherein the signal generator is comprised in an electronic device.

8. The oscillator signal generator according to claim 7, wherein the electronic device is any one of a transceiver, a transmitter, and a receiver.

9. The oscillator signal generator according to claim 2, further comprising a quantization noise accumulation compensation circuit coupled between the digital signal generator and the DAC.

10. The oscillator signal generator according to claim 9, wherein:
    when a rising edge between first samples of the digital signal adjacent to a zero crossing of the oscillator signal is detected in the comparator output signal, the control signal is generated by subtracting a weighted sum of the adjacent samples values before and after the zero crossing from a current value of the control signal; and
    when a falling edge between the first samples adjacent to the zero crossing is detected in the comparator output signal, the control signal is generated by adding a weighted sum of the adjacent samples values before and after the zero crossing from a current value of the control signal.

11. The oscillator signal generator according to claim 2, wherein:
    when a rising edge between first samples of the digital signal adjacent to a zero crossing of the oscillator signal is detected in the comparator output signal, the control signal is generated by subtracting a weighted sum of the adjacent samples values before and after the zero crossing from a current value of the control signal; and
    when a falling edge between the first samples adjacent to the zero crossing is detected in the signal generated by the comparator, the control signal is generated by adding a weighted sum of the adjacent samples values before and after the zero crossing from a current value of the control signal.

12. The oscillator signal generator according to claim 2, wherein the control signal is applied to control capacitance in the filter.

13. The oscillator signal generator according to claim 2, wherein the filter comprises any one or a combination of switched capacitors, varicaps and varactors.

14. An apparatus comprising:
    an oscillator signal generator configured to generate an oscillator signal, the oscillator signal generator comprising:
      a digital signal generator configured to generate a digital signal;
      a digital to analog converter (DAC) configured to receive and convert the digital signal to an analog signal;
      a filter configured to receive and filter the analog signal and generate the oscillator signal;
      a comparator configured to receive the oscillator signal and generate a comparator output signal indicating zero crossings of the oscillator signal;
      a digital control unit (DCU) configured to receive the comparator output signal and the digital signal and to generate a control signal to tune the filter to track a center frequency of the digital signal, the control signal being based at least in part on adjacent samples of the digital signal before and after zero crossings of the oscillator signal.

15. The apparatus according to claim 14, wherein the apparatus is a base station for a wireless communication system.

16. The apparatus according to claim 14, wherein the apparatus is a wireless communication device for a wireless communication system.

17. A method for generating an oscillator signal in an oscillator signal generator, the oscillator signal generator having a digital signal generator, a digital to analog converter (DAC), a filter, a comparator and a digital control unit, the method comprising:

generating by the digital signal generator, a digital signal;

converting by the DAC, the digital signal to an analog signal;

filtering by the filter, the analog signal to generate the oscillator signal;

generating by the comparator, a signal indicating zero crossings of the oscillator signal;

summing in the digital control unit, two adjacent samples of the digital signal before and after a zero crossing of the oscillator signal;

weighting in the digital control unit, the sum value with a coefficient;

generating in the digital control unit, a control signal based on the weighted sum value; and tuning the filter by the control signal to track a center frequency of the oscillator signal.

18. The method according to claim 17, wherein:

when a rising edge between first samples of the digital signal adjacent to an indicated zero crossing of the oscillator signal is detected, the control signal is generated by subtracting the weighted sum value from a current value of the control signal; and when a falling edge between the first samples adjacent to the indicated zero crossing is detected, the control signal is generated by adding the weighted sum value to a current value of the control signal.

19. The method according to claim 18, wherein tuning the filter by the control signal is performed by tuning capacitance of the filter.

20. The method according to claim 17, wherein tuning the filter by the control signal is performed by tuning capacitance of the filter.

\* \* \* \* \*